United States Patent [19]

Hallford

[11] 4,359,782
[45] Nov. 16, 1982

[54] MICROWAVE MIXER WITH LINKING JUXTAPOSED BALUN PORT

[75] Inventor: Ben R. Hallford, Wylie, Tex.
[73] Assignee: Rockwell International Corporation, El Segundo, Calif.
[21] Appl. No.: 265,127
[22] Filed: May 19, 1981
[51] Int. Cl.³ .......................... H04B 1/26; H03H 7/42
[52] U.S. Cl. ...................................... 455/327; 333/26; 455/330
[58] Field of Search ............... 455/325, 326, 327, 330, 455/331; 333/25, 26

[56] References Cited

U.S. PATENT DOCUMENTS

| | | |
|---|---|---|
| 3,652,941 | 3/1972 | Neuf . |
| 3,678,433 | 7/1972 | Hallford . |
| 3,831,097 | 8/1974 | Neuf . |
| 4,240,052 | 12/1980 | Hallford et al. |
| 4,245,356 | 1/1981 | Hallford ............................ 455/327 |
| 4,293,956 | 10/1981 | Alstatt ................................ 455/327 |

FOREIGN PATENT DOCUMENTS 22990 1/1981 European Pat. Off. ............. 333/26
2023954 1/1980 United Kingdom ................ 455/326

OTHER PUBLICATIONS

Julius Lange, "Interdigitated Strip-Line Quadrature Hybrid", 1969 International Microwave Symposium, Dallas, Texas, May 5-7, IEEE Cat. No. 69 c 6, pp. 10-13.

George L. Matthaei, et al., "Microwave Filters, Impedance-Matching Networks, and Coupling Structures", New York, McGraw-Hill, 1964, pp. 809-812.

Primary Examiner—Marc E. Bookbinder
Attorney, Agent, or Firm—Bruce C. Lutz; Howard R. Greenberg; H. Fredrick Hamann

[57] ABSTRACT

Microwave circuit layout and structure is disclosed for a diode bridge mixer. Linking structure provides interconnection from coplanar sections of balanced first and second conductors to non-coplanar sections juxtaposed on opposite sides of the substrate which are in turn interconnected to two pairs of parallel divergent coplanar grounding stubs which are juxtaposed third and fourth conductors on the other side of the substrate.

24 Claims, 3 Drawing Figures

MICROWAVE MIXER WITH LINKING JUXTAPOSED BALUN PORT

TECHNICAL FIELD

The invention relates to microwave diode mixers and associated circuitry for up and down conversion between high frequency signals (e.g., RF or LO in the 6 GHz range) and the low frequency signals (e.g., IF in the 70 MHz range), and more particularly to the circuit layout structure supplying the ports for a diode mixer bridge.

BACKGROUND AND SUMMARY

The present invention evolved from continuing development efforts pertaining to subject matter disclosed in my co-pending Application Ser. No. 216,872, filed Dec. 15, 1980, entitled "Balun Coupled Microwave Frequency Converter" now U.S. Pat. No. 4,330,868. This co-pending Application discloses a diode mixer bridge with a port, such as the RF input port, supplied by balanced coplanar conductors.

The width of the gap between the balanced coplanar conductors affects the impedance of that port to the mixer bridge. The narrower the gap, the lower the impedance. Depending on the impedance matching constraints of a particular application, there may arise a need for a gap which is too narrow to etch within prescribed manufacturing cost considerations.

One solution to this problem is provided by the subject matter disclosed and claimed in my co-pending Application Ser. No. 243,662, filed Mar. 13, 1981, entitled "Microwave Frequency Converter with Dual Balun Port". This co-pending Application relates to improvements in the microstrip circuit layout and structure for the balanced port. The dual balun enables requisite impedance matching to certain transmission lines without resorting to extremely narrow coupling gaps between the coplanar balanced conductors.

The present invention provides another solution to the impedance matching problem between balanced conductors. The present invention provides a sufficiently narrow coupling gap to reduce the impedance between the balanced conductors. The invention also provides increased capacity between the conductors. The requisite coupling gap and enhanced capacity are accomplished in a manufacturably cost efficient manner by juxtaposing the balanced conductors on opposite sides of the substrate. The thickness of the substrate is the width of the coupling gap between the balanced conductors, and hence there is no need to etch the narrow coupling gap, which is expensive.

Balanced conductors juxtaposed on opposite sides of a substrate is itself known in the art, for example as shown in U.S. Pat. No. 3,652,941 to Neuf.

The present invention relates to improvements in microstrip circuit layout and includes linking balun structure interconnecting coplanar sections of balanced conductors to non-coplanar sections juxtaposed on opposite sides of the substrate and supplying a balanced port to the mixer bridge. This enables a cost effectively implementable coupling gap between balanced conductors supplying a balanced port for a diode mixer bridge, and yet retains the efficiencies of transmission line coupling to balanced coplanar conductors. A transmission line is juxtaposed the coplanar sections of the conductors for interacting therewith to balun couple a field balanced between the conductors.

Further linking structure connects the diode mixer bridge on one side of the substrate to two pairs of parallel coplanar grounding stubs on the other side of the substrate, each pair diverging from a respective one of the juxtaposed conductors to the ground plane. Third and fourth conductors, juxtaposed respective stubs of each pair, provide the remaining ports to the mixer.

DETAILED DESCRIPTION

Figure 1:
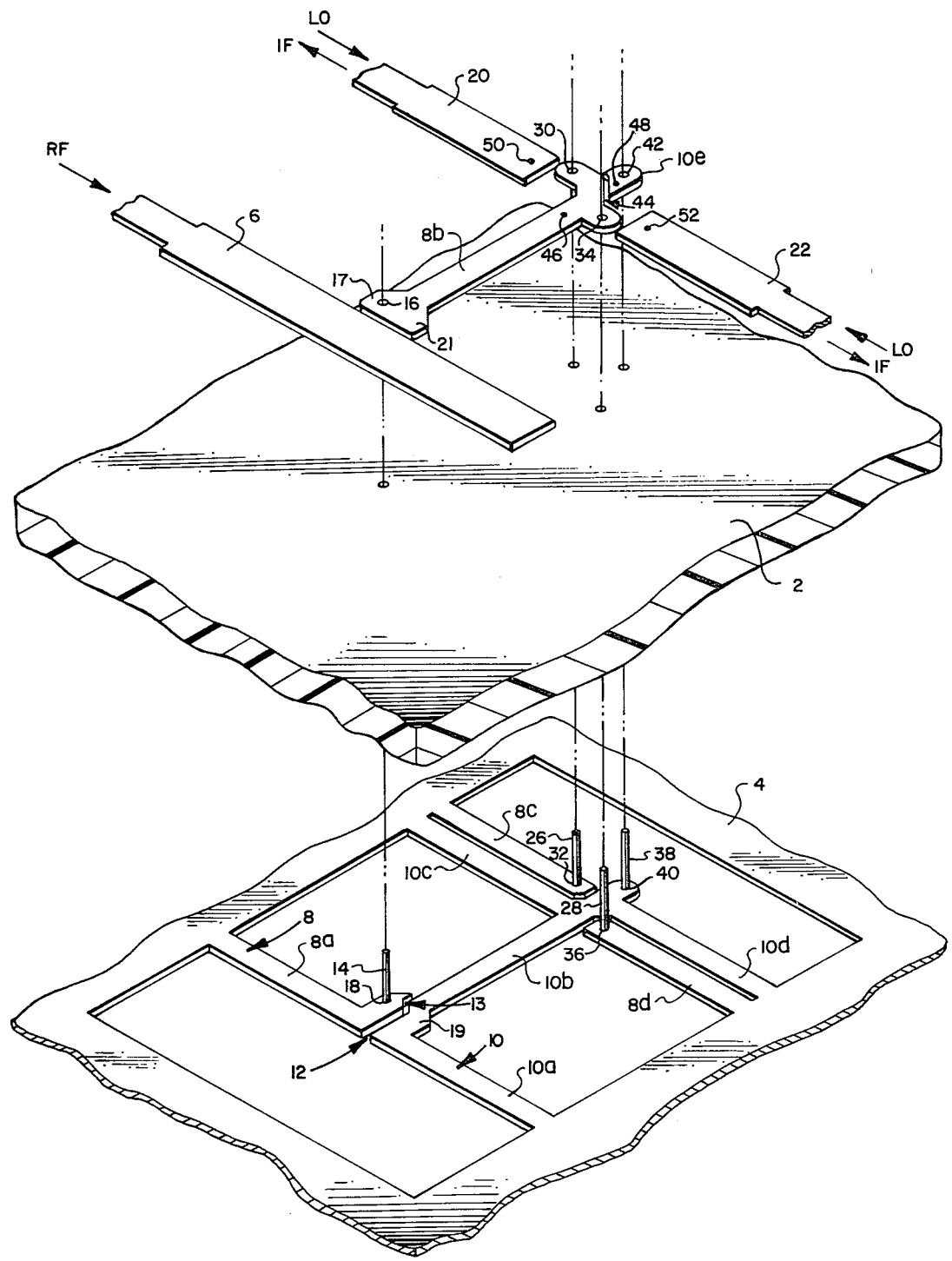
FIG. 1 is an exploded isometric view of microstrip circuit layout and structure constructed in accordance with the invention supplying the ports for a diode mixer bridge.
Figure 2:
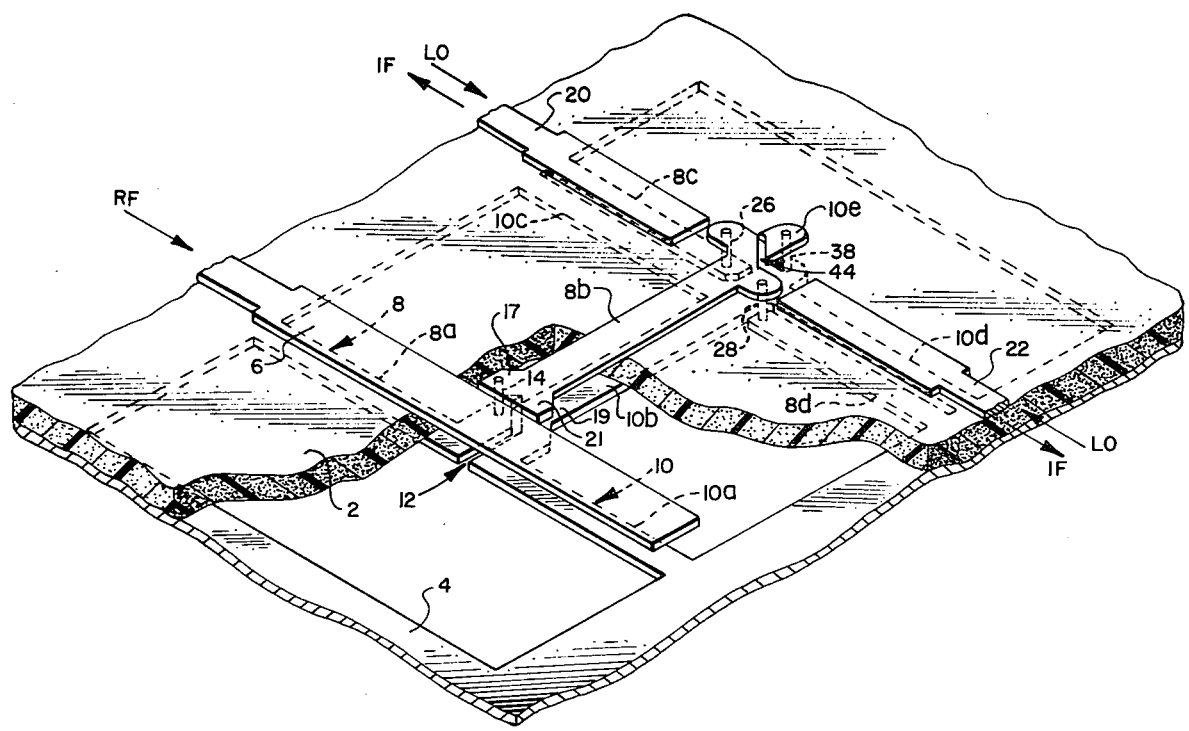
FIG. 2 is an assembly isometric view of the circuit layout and structure of FIG. 1.

Referring to FIGS. 1 and 2, a planar dielectric substrate 2 has a conductive ground plane 4 on its bottom surface which is etched to yield the conductor pattern shown. A conductive layer on the top of substrate 2 is likewise etched to yield the conductor pattern shown.

An input RF transmission line 6 on top of the substrate couples an RF signal to a pair of balanced secondary conductors 8 and 10 on the bottom of the substrate. First and second conductors 8 and 10 have first sections 8a and 10a extending from ground plane 4 towards each other to a separation gap 12 therebetween. Transmission line 6 is directly above sections 8a and 10a. The induced RF field exists across gap 12 between balanced conductor sections 8a and 10a.

Conductor 10 has a second extension section 10b extending rightwardly from section 10a on the bottom of substrate 2. Conductor 8 also has a second extension section 8b. Section 8b is on top of substrate 2 directly above extension section 10b. A bus wire link 14 extends through substrate 2 to ohmically connect conductor sections 8a and 8b. Link 14 is connected to the conductor sections through apertures 16 and 18. Conductor extension sections 8b and 10b are laterally shifted at transitions 17 and 19, respectively, towards each other to afford a direct overlay thereof. Gap 12 is conformingly configured at transition 13 to retain separation between conductors 8 and 10 on the bottom side of the substrate. The induced RF field across gap 12 between balanced conductor sections 8a and 10a also exists between juxtaposed conductor extension sections 8b and 10b through substrate 2.

Figure 3:
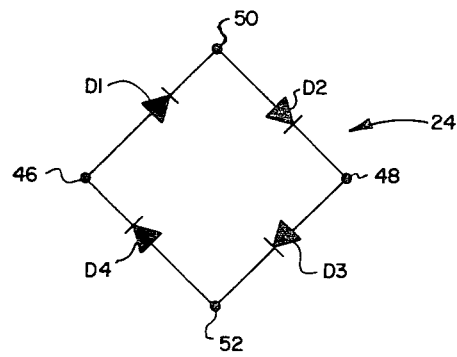
FIG. 3 shows the diode mixer bridge connection for FIG. 2.

Third and fourth conductors 20 and 22 are on the top side of the substrate and carry an LO signal for mixing with the induced RF signal between balanced conductor extension sections 8b and 10b for heterodyne modulation product signal generation. The connection of mixer bridge 24, FIG. 3, is described hereinafter.

Conductor extension section 10b has a pair of stubs 10c and 10d diverging therefrom to ground plane 4. Conductor extension section 8b also has a pair of stubs 8c and 8d diverging therefrom to ground plane 4. A pair of bus wire links 26 and 28 extend down through the substrate and ohmically connect the end of conductor extension section 8b to respective stubs 8c and 8d on the bottom of the substrate. Link 26 is connected through aperture 30 in top conductor extension section 8b and aperture 32 in bottom stub 8c. Link 28 is connected through aperture 34 in top conductor extension section 8b and aperture 36 in bottom stud 8d.

The first stubs 8c and 10c of each pair of juxtaposed directly below the third conductor 20 on the other side of the substrate. The second stubs 8d and 10d of each pair are juxtaposed directly below the fourth conductor 22 on the other side of the substrate. First stubs 8c and 10c extend in spaced parallel coplanar relation, with stub 10c being coplanarly connected to extension 10b, and stub 8c being connected to extension 8b by link 26 through substrate 2. The second stubs 8d and 10d likewise extend in spaced parallel coplanar relation, with stub 10d being coplanarly connected to extension 10b, and stub 8d being connected to extension section 8b by link 28 through substrate 2. The first pair of stubs 8c and 8d are in spaced parallel relation with the second pair of stubs 10c and 10d. One stub of the first pair is colinear with one stub of the second pair, e.g., stubs 8c and 10d. The other stub of the first pair is colinear with the other stub of the second pair, e.g., stubs 10c and 8d.

Conductor extension section 10b on the bottom of substrate 2 has a linked section 10e on the top of substrate 2. Sections 10e and 10b are ohmically connected by a bus wire link 38 extending through the substrate and connection apertures 40 and 42. Linked section 10e on top of the substrate is spaced from conductor extension section 8b on top of the substrate by separation gap 44.

Diode quad mixer bridge 24, FIG. 3, is connected on the top of the substrate to a single point on each of the conductors, as shown at point 46 for the first conductor 8, point 48 for the second conductor 10, point 50 for the third conductor 20, and point 52 for the fourth conductor 22. This single point connection prevents unwanted phase shift otherwise caused by a finite traversal distance for image current on one or more of the conductors.

In operation, when implemented as a down converter, an RF signal is input on transmission line 6 and two quadrature LO signals are input at the ports provided by conductors 20 and 22. The RF signal is coupled from transmission line 6 to the first and second conductors 8 and 10 which in turn provide a balanced port to the mixer diode quad 24. Mixer 24 receives the RF and LO signals and outputs a plurality of frequencies, including an IF signal at a frequency which is the difference between the RF and LO signal frequencies. The frequencies which are output from mixer 24 are the modulation products which exist according to the heterodyne principle by which the mixer operates, as known in the art, wherein an RF signal and an LO signal are applied to a nonlinear element such as a diode. The RF and LO signals are mixed in the diode quad to generate the various modulated frequencies, including an IF signal on conductors 20 and 22. These IF signals may be passed through IF bandpass filters, such as described in my U.S. Pat. No. 3,678,433, issued July 18, 1972, entitled "RF Rejection Filter". These filters may be connected to a 90° quadrature hybrid 3 dB coupler, for example as shown in U.S. Pat. No. 3,831,097 to Neuf. Filtering circuitry may also be provided for the LO signals, for example by providing LO bandpass capacitors or filters (IF rejection filters), such as described in my U.S. Pat. No. 4,240,052, issued Dec. 16, 1980, entitled "Balun Filter Apparatus". These filters may be coupled through a branchline coupler, for example as described in "Microwave Filters, Impedance-Matching Networks, and Coupling Structures", George L. Matthaei et al., McGraw-Hill, New York, 1964, pp. 809–812, or through a Lange-type interdigitated 90° quadrature hybrid 3 dB coupler, for example as described in "Interdigitated Strip-Line Quadrature Hybrid", Julius Lange, 1969 International Microwave Symposium, Dallas, Texas, May 5–7, IEEE Cat. No. 69 c 6, pp. 10–13.

When implemented as an up converter, LO and IF signals are each input at the ports provided by conductors 20 and 22, and an RF signal is induced on transmission line 6 from conductors 8 and 10 acting as primaries. In other applications, for both up and down converters, the RF and LO signals are transposed.

In some applications, it was desired to employ conductors no less than 40 mils wide and gaps therebetween no less than about 6 mils. Some of these arrangements were found to have an impedance over 100 ohms, which was undesirable because it did not match existing 50 ohm transmission lines. To reduce the impedance of the balanced port to the mixer bridge provided by coplanar conductors, it was necessary to reduce the width of the gap therebetween to about 3 mils. This in turn was not desirable because a 3 mil gap was deemed too narrow to etch within prescribed manufacturing cost considerations.

The present invention provides a 50 ohm impedance match without resorting to costly narrow gap formation. In the preferred embodiment of the present invention, the width of the wide section of transmission line 6 is 60 mils. The width of the wide sections of third and fourth conductors 20 and 22 is 108 mils. The width of conductor sections 8a, 8b and 10b is 60 mils. The width of gaps 12 and 44 is 6 mils. The width of the gap between stubs 8c and 10c and between 8d and 10d is 36 mils. The width of the stubs is 36 mils. The length of conductor sections 8a and 10a, and of stubs 8c, 8d, 10c and 10d is one-quarter wavelength of the RF signal. The substrate has a dielectric constant of 2.17 and a thickness of 15 mils.

The left end of conductor section 8b is widened as shown at 21 in order to be juxtaposed the conductor portions on both sides of gap 12 therebelow. This has been found to facilitate desirable 50 ohm impedance matching.

The structure of FIG. 1 affords increased capacity between conductor extensions 8b and 10b supplying a balanced port to the mixer diodes. This increased capacity between these conductor sections affords a 50 ohm match without resorting to extremely narrow gaps as is sometimes required with coplanar balanced conductors. The invention retains the efficiencies of coupling between transmission line 6 and a pair of balanced coplanar conductor sections 8a and 10a.

It is a significant aspect of the invention that low dielectric constant substrate material may be used. This enables cost reduction over the more expensive high dielectric constant substrate material required by various mixer circuits. These mixers suffer various constraints on dimensions and spacings, and provide requisite close field confinement by the use of dielectric substrate having a high magnitude of relative dielectric constant of 9 to 10 or greater.

Another desirable aspect of the invention is the compactness of the circuit. For example, strip conductors 8b and 10b may be shortened to very small lengths limited only by the allowable coupling between conductor 6 to conductors 20 and 22.

In another desirable aspect of the invention, the circuit layout structure is fabricated using standard printed circuit board techniques. A simple off-the-shelf dielectric substrate which is copper clad on both sides is used. The copper is merely etched away to yield the conductor patterns shown.

The disclosed circuit layout provides mutual isolation between the RF, LO and IF signals. The LO signal on conductor 20 is isolated from conductor 22 because of the effective ground provided by points 48 and 46. One LO signal path from point 50 of conductor 20 to point 52 of conductor 22 is through diodes D2 and D3. However, the junction point therebetween is the effective ground point 48 and hence the LO signal may flow from conductor point 50 through diode D2 but is isolated from conductor point 52. Point 48 is an effective ground point relative to LO signals because of its ohmic connection through link section 10e and link 38 to aperture connection 40 and the pair of grounding stubs 10c and 10d which provide ground return to ground plane 4. The other LO signal path from conductor point 50 to conductor point 52 is through diodes D1 and D4, but the junction point therebetween is the effective ground point 46. Point 46 is an effective ground point relative to LO signals because of its ohmic connection through aperture connections 30 and 34 and links 26 and 28 to aperture connections 32 and 36, FIG. 3, which in turn provide a ground return through the pair of grounding stubs 8c and 8d to the ground plane 4. LO signals from point 52 are likewise isolated from point 50. In an alternate implementation, the diode ring 24 may be replaced by a diode quad with the polarities of diodes D3 and D4 reversed, for even greater isolation.

The RF signal on balanced junction points 46 and 48 due to the induced RF field therebetween across conductor extensions 8b and 10b is isolated from conductors 20 and 22. The RF signal from junction point 46 flows through diode D1 and then diode D2 to junction point 48. Since RF conductor points 46 and 48 are balanced, they are each other's reference points, and hence the voltage on junction point 46 is referenced to junction point 48, not to ground. The RF signal from junction point 46 flows through diode D1 toward point 50 and then away from point 50 through diode D2. Conductor point 50 thus sees opposite polarities (voltages which are 180 degrees out of phase), and hence no new or additional net voltage is induced on conductor point 50 from the RF signal between conductor points 46 and 48. The RF signal between junction points 46 and 48 is likewise isolated from conductor 22 and its conductor point 52.

The LO signals on conductors 20 and 22 are isolated from the RF signal between RF conductor points 46 and 48. The LO signal on conductor point 50 sees an effective ground at each of points 46 and 48 due to the grounding stubs, whereby to add the same effective voltage to each in parallel, resulting in no change of the net voltage difference between points 46 and 48. The LO signal on conductor 20 sees equal reference levels at points 46 and 48 due to stubs 8c and 10c along which conductor 20 extends in closely spaced parallel relation. The LO signal on conductor point 52 is likewise isolated from the RF signal between points 46 and 48.

It is recognized that various modifications are possible within the scope of the appended claims.

I claim:

1. Balun coupled microwave mixer circuit layout and structure comprising:

a dielectric substrate having two sides;

ground plane means on said substrate;

first and second conductors having first coplanar sections on one side of said substrate extending from said ground plane means towards each other to a separation gap therebetween, and having second extension sections extending in spaced parallel relation, said second extension sections juxtaposed on opposite sides of said substrate, one of said extension sections being connected to the first section of its respective said conductor by a link through said substrate;

a transmission line on the other side of said substrate and juxtaposed said first sections of said first and second conductors for interacting therewith to balun couple a field balanced between said first and second conductors across said gap between said coplanar first sections and across the substrate between said juxtaposed extension sections;

third and fourth spaced conductors on said substrate; and a diode mixer interconnecting all of said conductors for heterodyne modulation product signal generation.

2. The invention according to claim 1 wherein each of said extension sections of said first and second conductors has a pair of stubs diverging therefrom to said ground plane means, a first stub of each pair juxtaposed said third conductor, and a second stub of each pair juxtaposed said fourth conductor.

3. The invention according to claim 2 wherein:

said first stubs extend in spaced parallel coplanar relation, one stub being connected to the extension section of its respective said conductor by a link through said substrate; and said second stubs extend in spaced parallel coplanar relation, one stub being connected to the extension section of its respective said conductor by a link through said substrate.

4. The invention according to claim 3 wherein all said stubs are on said one side of said substrate.

5. The invention according to claim 4 wherein:

the conductor extension section on said one side of said substrate has a link through said substrate to the other side; and said diode mixer is on said other side of said substrate and is connected to said first, second, third and fourth conductors at a single point on each.

6. The invention according to claim 1 wherein:

said extension section of said first conductor is on said other side of said substrate and is connected to a pair of links through said substrate which are respectively connected to a pair of stubs on said one side of said substrate, said stubs extending in opposite directions from said pair of links to said ground plane means; and said extension section of said second conductor is on said one side of said substrate and has a pair of stubs extending in opposite directions from said second conductor extension section to said ground plane means.

7. The invention according to claim 6 wherein said first mentioned pair of stubs is in spaced parallel relation with said second mentioned pair of stubs, with one stub of the first pair being colinear with one stub of the second pair, and the other stub of the first pair being colinear with the other stub of the second pair.

8. The invention according to claim 1 wherein said diode mixer is connected by leads to respective said conductors at a single point on each to prevent unwanted phase shift otherwise caused by a finite traversal distance for image current on one or more of the conductors.

9. Balun coupled microwave mixer circuit layout and structure comprising:
a dielectric substrate having two sides;
ground plane means on said substrate;
first and second conductors having first coplanar sections on one side of said substrate extending from said ground plane means towards each other to a separation gap therebetween, and having second extension sections extending in spaced parallel relation, said second extension sections juxtaposed on opposite sides of said substrate, one of said extension sections being connected to the first section of its respective said conductor by a link through said substrate;
a transmission line on the other side of said substrate and juxtaposed said first sections of said first and second conductors for interacting therewith to balun couple a field balanced between said first and second conductors across said gap between said coplanar first sections and across the substrate between said juxtaposed extension sections;
third and fourth spaced conductors on said substrate; and
a diode mixer interconnecting all of said conductors for heterodyne modulation product signal generation and isolating signals on said first and second conductors from signals on said third and fourth conductors.

10. The invention according to claim 9 wherein said diode mixer is connected between connection points on said conductors, and further comprising means setting the connection points on said first and second conductors at substantially the same potential reference level relative to signals on said third and fourth conductors such that no net potential is induced between said first and second conductors from either of said third and fourth conductors such that signals on said third and fourth conductors are isolated from said first and second conductors.

11. The invention according to claim 10 wherein said setting means further provides at each said first and second conductor connection points a low impedance effective ground relative to signals on said third and fourth conductors such that signals on said third conductor are isolated from said fourth conductor, and signals on said fourth conductor are isolated from said third conductor.

12. The invention according to claim 11 wherein said last mentioned means comprises stub means extending from said first and second conductors to said ground plane means.

13. The invention according to claim 12 wherein each of said first and second conductors has a pair of stubs diverging therefrom to said ground plane means.

14. The invention according to claim 13 wherein said third conductor is juxtaposed a first stub of each of said pair, and said fourth conductor is juxtaposed a second stub of each said pair.

15. The invention according to claim 14 wherein:
all said stubs are on said one side of said substrate;
said extension section of said first conductor is on said other side of said substrate and is connected to a pair of links through said substrate which are respectively connected to a first pair of stubs on said one side of said substrate, said stubs extending in opposite directions from said pair of links to said ground plane means;
said extension section of said second conductor is on said one side of said substrate and has a second pair of stubs extending in opposite directions from said second conductor extension section to said ground plane means;
the first stub of each said pair extending in spaced parallel coplanar relation juxtaposed said third conductor;
the second stub of each said pair extending in spaced parallel coplanar relation juxtaposed said fourth conductor.

16. Balun coupled microwave mixer circuit layout and structure comprising:
a dielectric substrate having two sides and being of low relative dielectric constant substantially less than 9;
ground plane means on said substrate;
first and second conductors having first coplanar sections on one side of said substrate extending from said ground plane means towards each other to a separation gap therebetween, and having second extension sections extending in spaced parallel relation, said second extension sections juxtaposed on opposite sides of said substrate, one of said extension sections being connected to the first section of its respective said conductor by a link through said substrate;
a transmission line on the other side of said substrate and juxtaposed said first sections of said first and second conductors for interacting therewith to balun couple a field balanced between said first and second conductors across said gap between said coplanar first sections and across the substrate between said juxtaposed extension sections;
third and fourth spaced conductors on said substrate; and
a diode mixer interconnection all of said conductors for heterodyne modulation product signal generation.

17. The invention according to claim 16 wherein the width of said conductors is no less than about 40 mils, and the width of said gap is no less than about 6 mils.

18. The invention according to claim 17 wherein the width of said gap is about 6 mils, the thickness of said substrate is about 15 mils, and said dielectric constant is about 2.

19. The invention according to claim 18 wherein the width of said transmission line, said first sections of said first and second conductors, and said extension sections of said first and second conductors is about 60 mils.

20. The invention according to claim 19 wherein the width of said third and fourth conductors is about 108 mils.

21. The invention according to claim 16 wherein said circuit layout and structure is fabricated on a printed circuit board comprising said dielectric substrate clad with metal, said metal etched to provide a microstrip pattern forming said ground plane means, said first, second, third and fourth conductors, and said transmission line.

22. Balun coupled microwave mixer circuit layout and structure comprising:
a dielectric substrate having two sides;

ground plane means on said substrate;

first and second conductors having first coplanar sections on one side of said substrate extending from said ground plane means towards each other to a separation gap therebetween, and having second extension sections extending in spaced parallel relation, said second extension sections juxtaposed on opposite sides of said substrate, one of said extension sections being connected to the first section of its respective said conductor by a link through said substrate, each of said first and second conductors having a pair of stubs diverging therefrom to said ground plane means;

a transmission line on the other side of said substrate and juxtaposed said first sections of said first and second conductors for interacting therewith to balun couple a field balanced between said first and second conductors across said gap between said coplanar first sections and across the substrate between said juxtaposed extension sections;

third and fourth conductors on said substrate, said third conductor juxtaposed a first stub of each said pair, and said fourth conductor juxtaposed a second stub of each said pair; and a diode mixer interconnecting all of said conductors for heterodyne modulation product signal generation, each of said first sections of said first and second conductors, and each of said stubs having a length about one-quarter wave length of a signal on said transmission line.

23. The invention according to claim 22 wherein the width of said conductors is no less than about 40 mils, and the width of said gap is no less than about 6 mils.

24. The invention according to claim 23 wherein the width of said third and fourth conductors is about 108 mils, wherein the width of said stubs is about 36 mils and the first stubs of each said pair and the second stubs of each said pair are respectively separated by a gap of about 36 mils.

* * * * *